US011506633B2

(12) United States Patent
Embleton et al.

(10) Patent No.: US 11,506,633 B2
(45) Date of Patent: Nov. 22, 2022

(54) SYSTEM AND METHOD FOR SERVICE LIFE MANAGEMENT BASED ON PROACTIVE REMEDIATION OF CORROSION ENHANCING DEFECTS

(71) Applicant: Dell Products L.P., Hopkinton, MA (US)

(72) Inventors: Steven Embleton, Austin, TX (US); Jon Taylor Fitch, Austin, TX (US)

(73) Assignee: Dell Products L.P., Hopkinton, MA (US)

( * ) Notice: Subject to any disclaimer, the term of this patent is extended or adjusted under 35 U.S.C. 154(b) by 187 days.

(21) Appl. No.: 16/938,344

(22) Filed: Jul. 24, 2020

(65) Prior Publication Data
US 2022/0026394 A1 Jan. 27, 2022

(51) Int. Cl.
*G01N 27/90* (2021.01)
*H05K 1/18* (2006.01)

(52) U.S. Cl.
CPC ..... *G01N 27/9046* (2013.01); *G01N 27/9073* (2013.01); *H05K 1/185* (2013.01)

(58) Field of Classification Search
CPC . H05K 1/185; G01N 27/9073; G01N 27/9046
See application file for complete search history.

(56) References Cited

U.S. PATENT DOCUMENTS

| 6,204,669 | B1 * | 3/2001 | Beard | G01M 3/027 |
| | | | | 324/557 |
| 6,452,410 | B1 * | 9/2002 | Parker | G01R 31/2805 |
| | | | | 324/754.04 |
| 2005/0194262 | A1 * | 9/2005 | Heimann | C25D 9/08 |
| | | | | 205/704 |
| 2017/0328864 | A1 * | 11/2017 | Endou | G01N 27/83 |
| 2018/0190170 | A1 * | 7/2018 | Yang | G09G 3/3208 |

FOREIGN PATENT DOCUMENTS

WO  WO-2011048001 A  *  4/2011  ............. G01N 31/22

* cited by examiner

*Primary Examiner* — Son T Le
*Assistant Examiner* — Adam S Clarke
(74) *Attorney, Agent, or Firm* — Chamberlain, Hrdlicka, White, Williams & Aughtry

(57) ABSTRACT

A defect inspection system includes a storage. The defect inspection system also includes a corrosion enhancing defect manager that obtains a circuit card including a trace that is to be encapsulated by a protective layer adapted to reduce corrosion of the trace; applies a voltage potential to the trace while the circuit card is disposed in a visual indicator bath; obtains an image of the trace while the voltage potential is applied; makes a determination, based on the image, that a visual indicator generated by the visual indicator bath is included in the image; and based on the determination: identifies a portion of the trace corresponding to the visual indicator; and applies encapsulant to the portion of the trace.

20 Claims, 9 Drawing Sheets

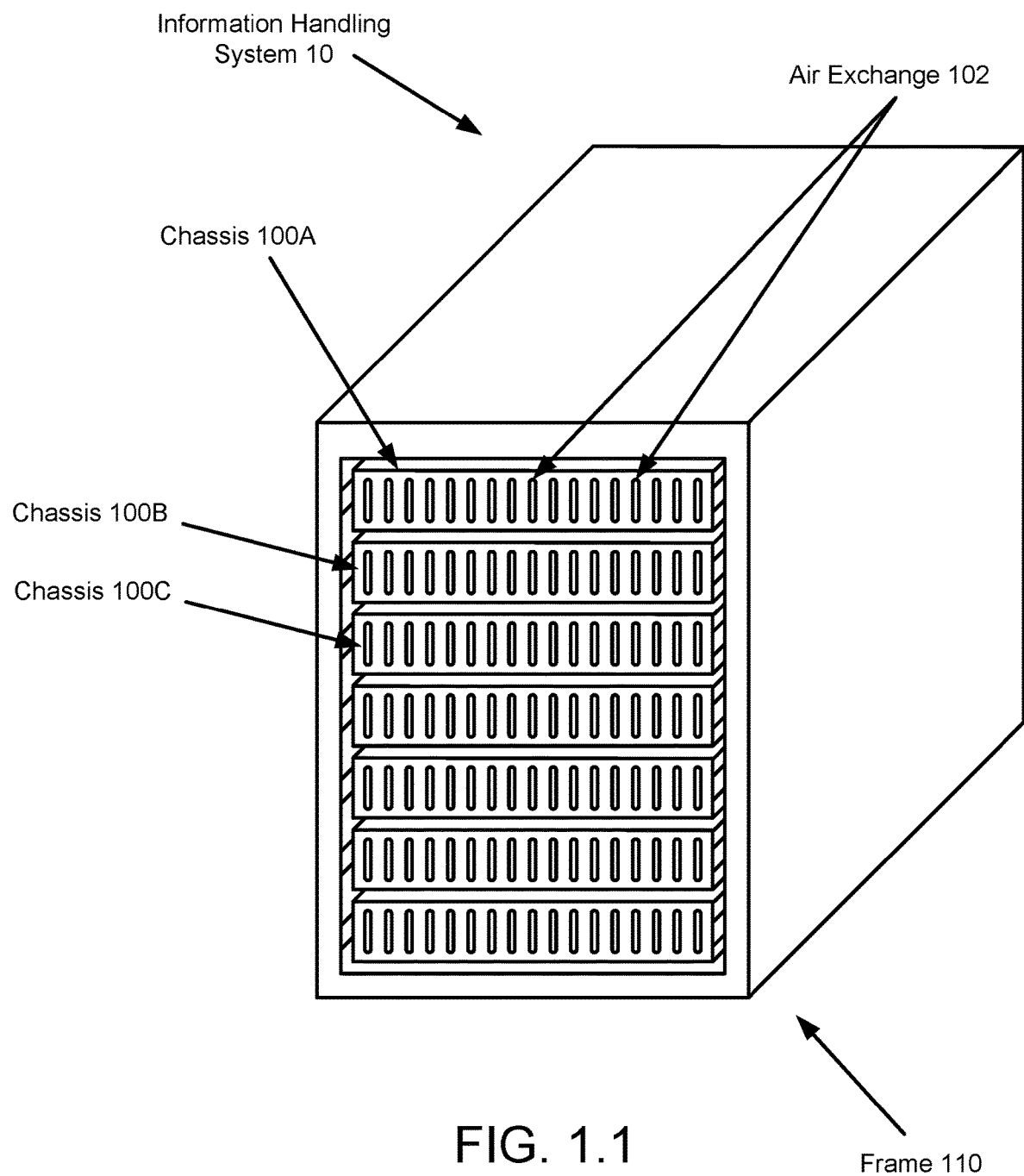
FIG. 1.1

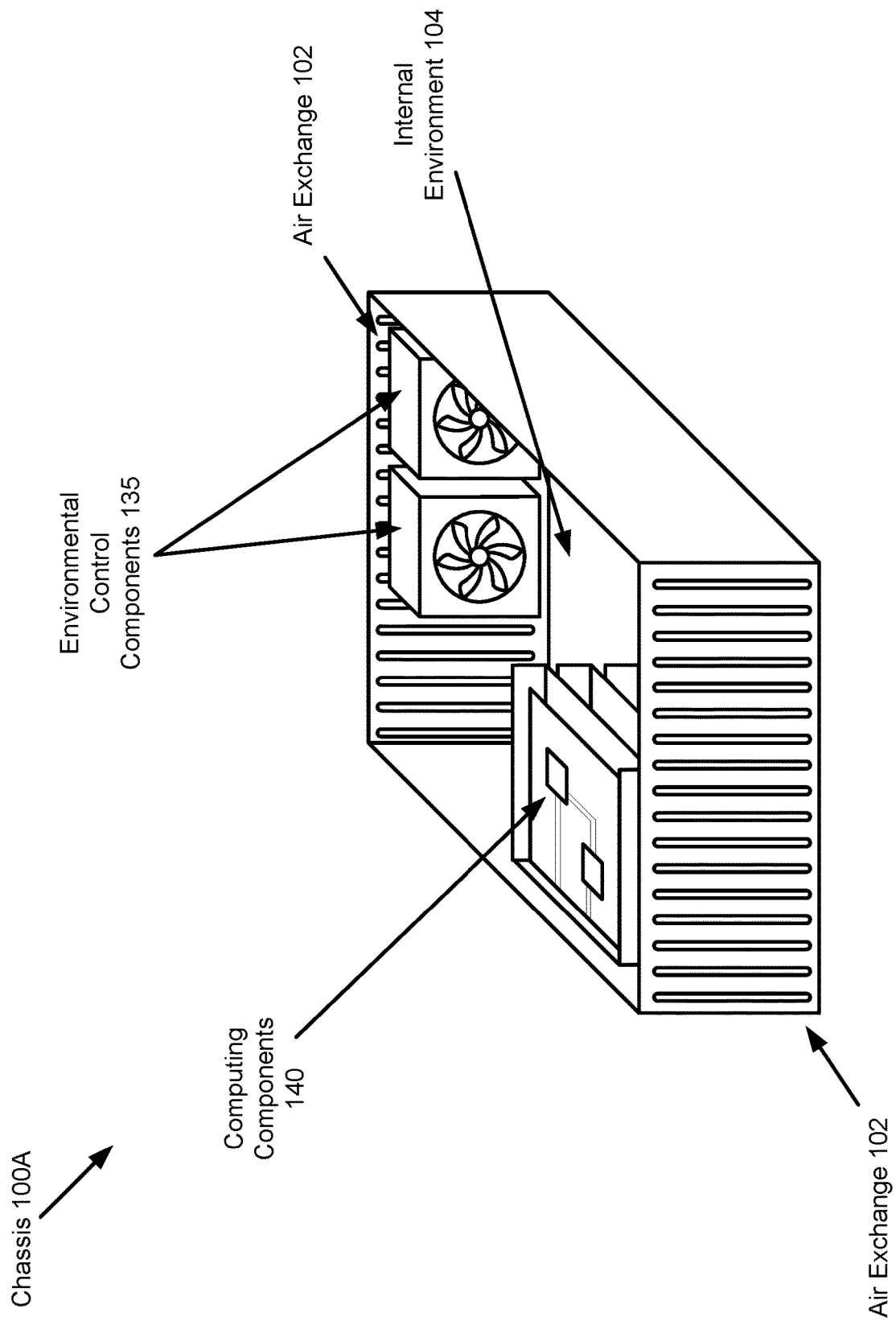
FIG. 1.2

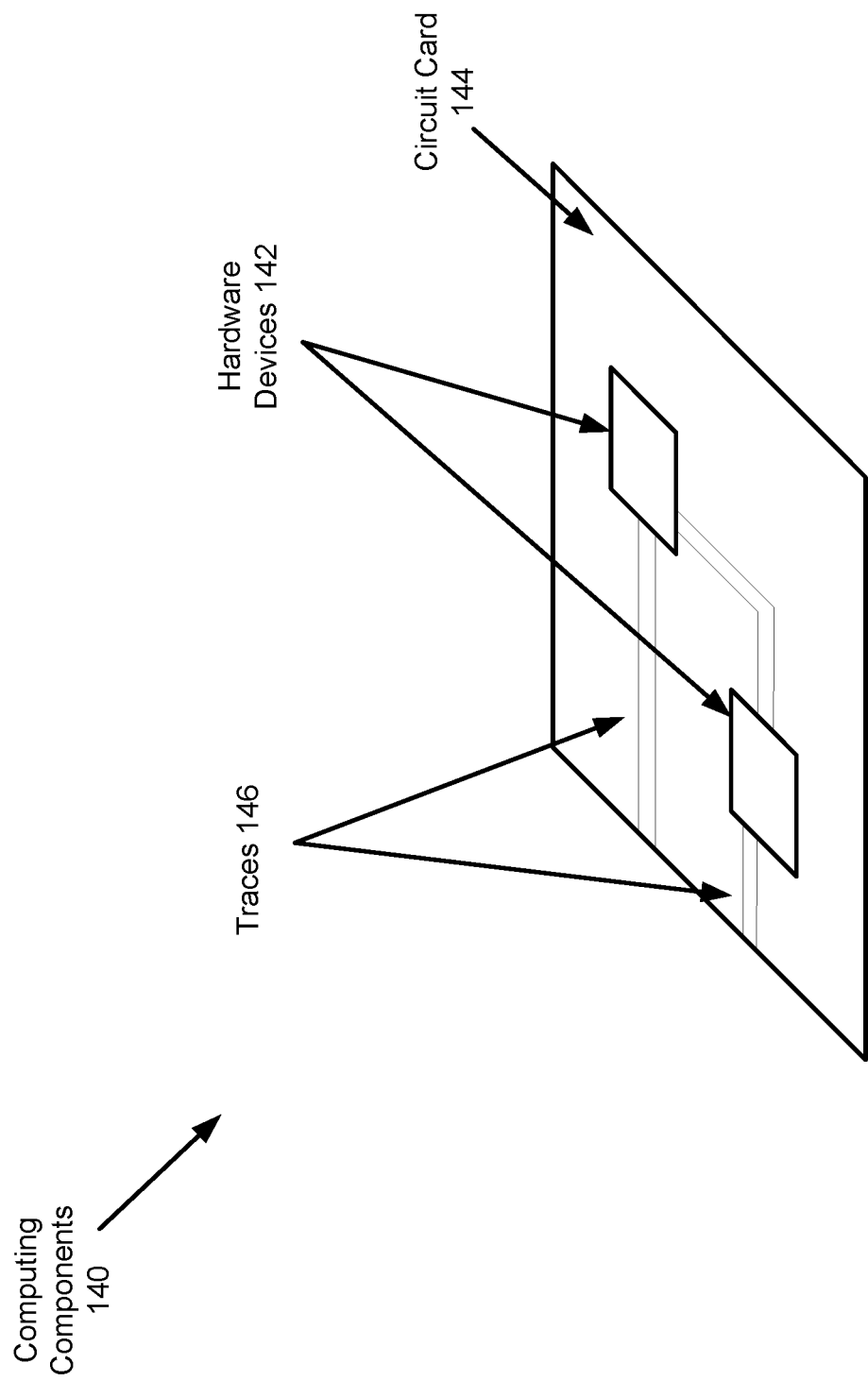
FIG. 1.3

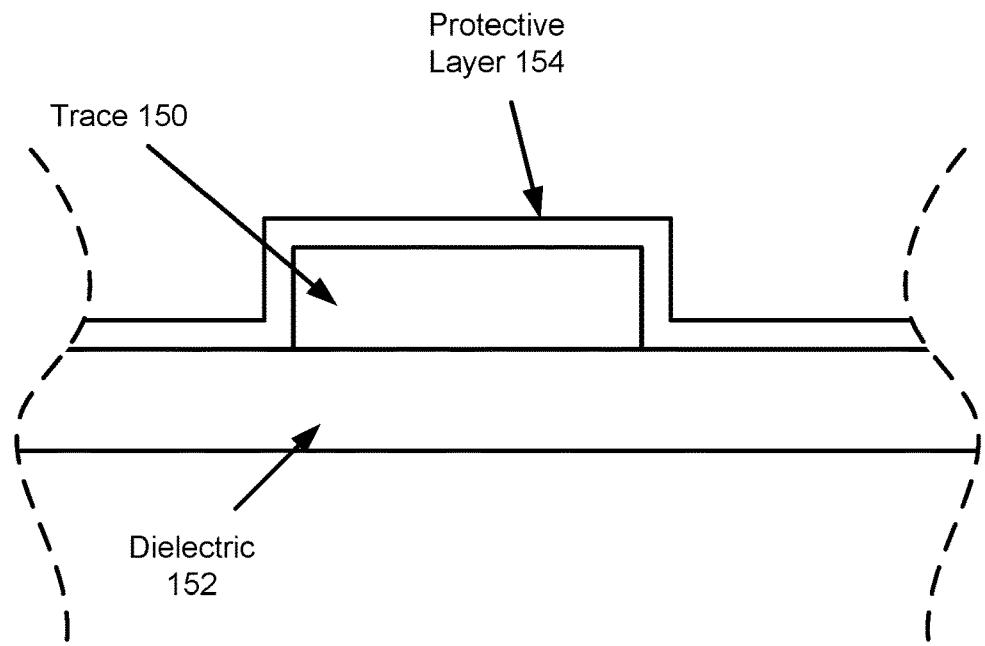
FIG. 1.4
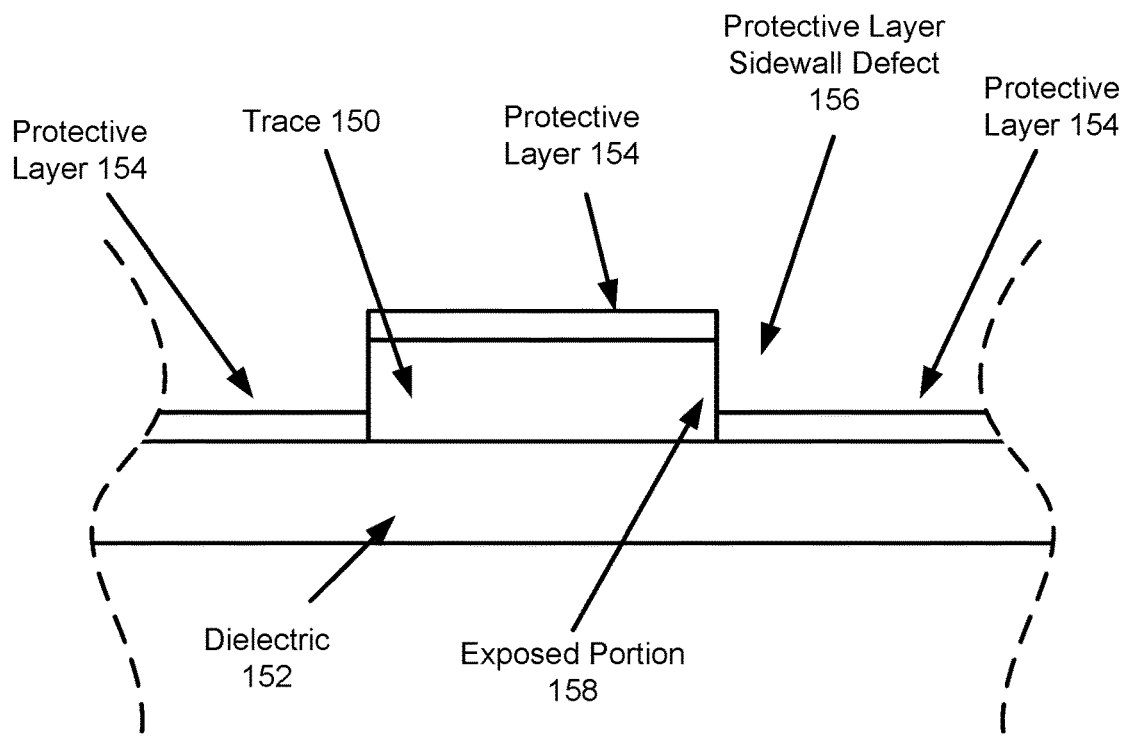
FIG. 1.5

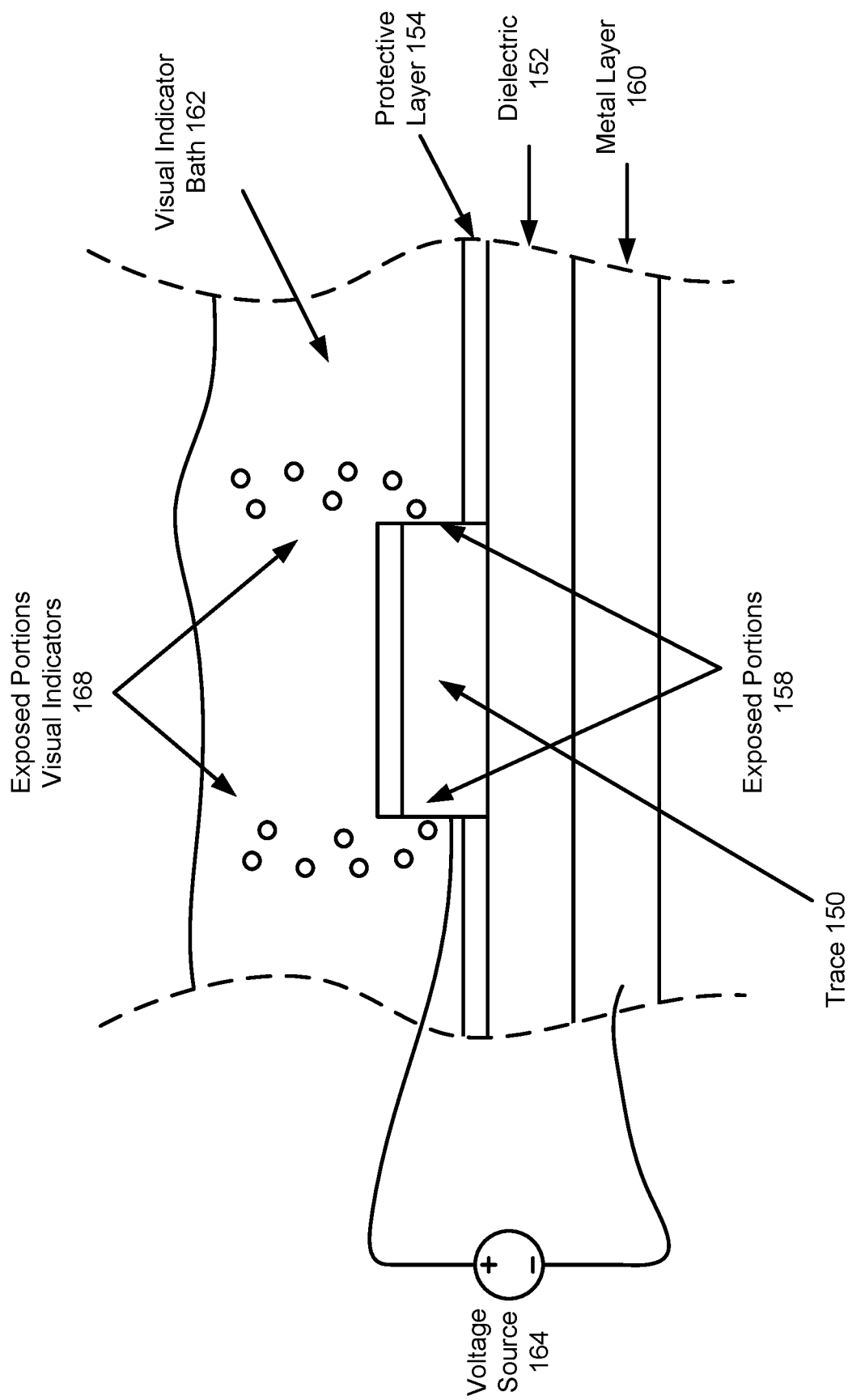
FIG. 1.6

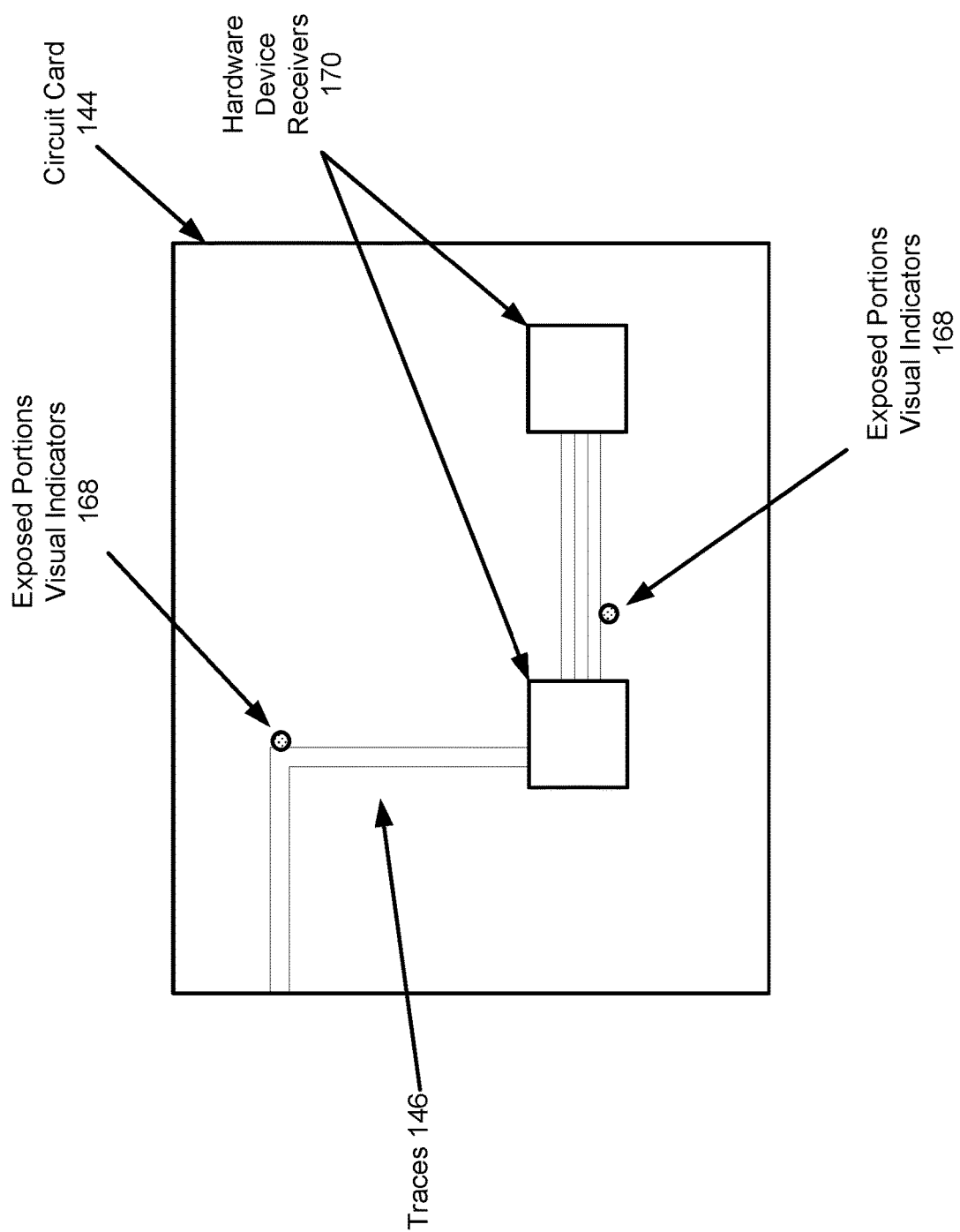
FIG. 1.7

SYSTEM AND METHOD FOR SERVICE LIFE MANAGEMENT BASED ON PROACTIVE REMEDIATION OF CORROSION ENHANCING DEFECTS

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack many information handling systems in a vertical arrangement. Due to the changing uses of information handling systems, chassis of information handling systems may modular. That is, a chassis may be composed of multiple enclosures that may be attached to each other to form the chassis of the information handling systems. When the multiple enclosures are attached, components of the information handling system disposed in each of the enclosures may become operably connected to each other.

SUMMARY

In one aspect, a defect inspection system in accordance with one or more embodiments of the invention includes storage; and a corrosion enhancing defect manager that obtains a circuit card includes a trace that is to be encapsulated by a protective layer adapted to reduce corrosion of the trace; applies a voltage potential to the trace while the circuit card is disposed in a visual indicator bath; obtains an image of the trace while the voltage potential is applied; makes a determination, based on the image, that a visual indicator generated by the visual indicator bath is included in the image; and based on the determination: identifies a portion of the trace corresponding to the visual indicator; and applies encapsulant to the portion of the trace.

In one aspect, a method for managing corrosion enhancing defects in circuit cards in accordance with one or more embodiments of the invention includes obtaining a circuit card of the circuit cards, the circuit card includes a trace that is to be encapsulated by a protective layer adapted to reduce corrosion of the trace; applying a voltage potential to the trace while the circuit card is disposed in a visual indicator bath; obtaining an image of the trace while the voltage potential is applied; making a determination, based on the image, that a visual indicator generated by the visual indicator bath is included in the image; and based on the determination: identifying a portion of the trace corresponding to the visual indicator as including a corrosion enhancing defect of the corrosion enhancing defects; and applying encapsulant to the portion of the trace to remediate the corrosion enhancing defect.

In one aspect, non-transitory computer readable medium includes computer readable program code, which when executed by a computer processor enables the computer processor to perform a method for managing corrosion enhancing defects in circuit cards, the method in accordance with one or more embodiments of the invention includes obtaining a circuit card of the circuit cards, the circuit card includes a trace that is to be encapsulated by a protective layer adapted to reduce corrosion of the trace; applying a voltage potential to the trace while the circuit card is disposed in a visual indicator bath; obtaining an image of the trace while the voltage potential is applied; making a determination, based on the image, that a visual indicator generated by the visual indicator bath is included in the image; and based on the determination: identifying a portion of the trace corresponding to the visual indicator as including a corrosion enhancing defect of the corrosion enhancing defects; and applying encapsulant to the portion of the trace to remediate the corrosion enhancing defect.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an information handling system in accordance with one or more embodiments of the invention.

FIG. 1.2 shows a diagram of a chassis of an information handling systems in accordance with one or more embodiments of the invention.

FIG. 1.3 shows a diagram of computing components in accordance with one or more embodiments of the invention.

FIG. 1.4 shows a side view diagram of a fully encapsulated trace in accordance with one or more embodiments of the invention.

FIG. 1.5 shows a side view diagram of a partially encapsulated trace having an exposed portion in accordance with one or more embodiments of the invention.

FIG. 1.6 shows a diagram of a process of identifying the presence of exposed portions of a trace in accordance with one or more embodiments of the invention.

FIG. 1.7 shows a top view diagram of a circuit card and exposed portions visual indicators highlighting defects in a protective layer in accordance with one or more embodiments of the invention.

DETAILED DESCRIPTION

Figure 2:
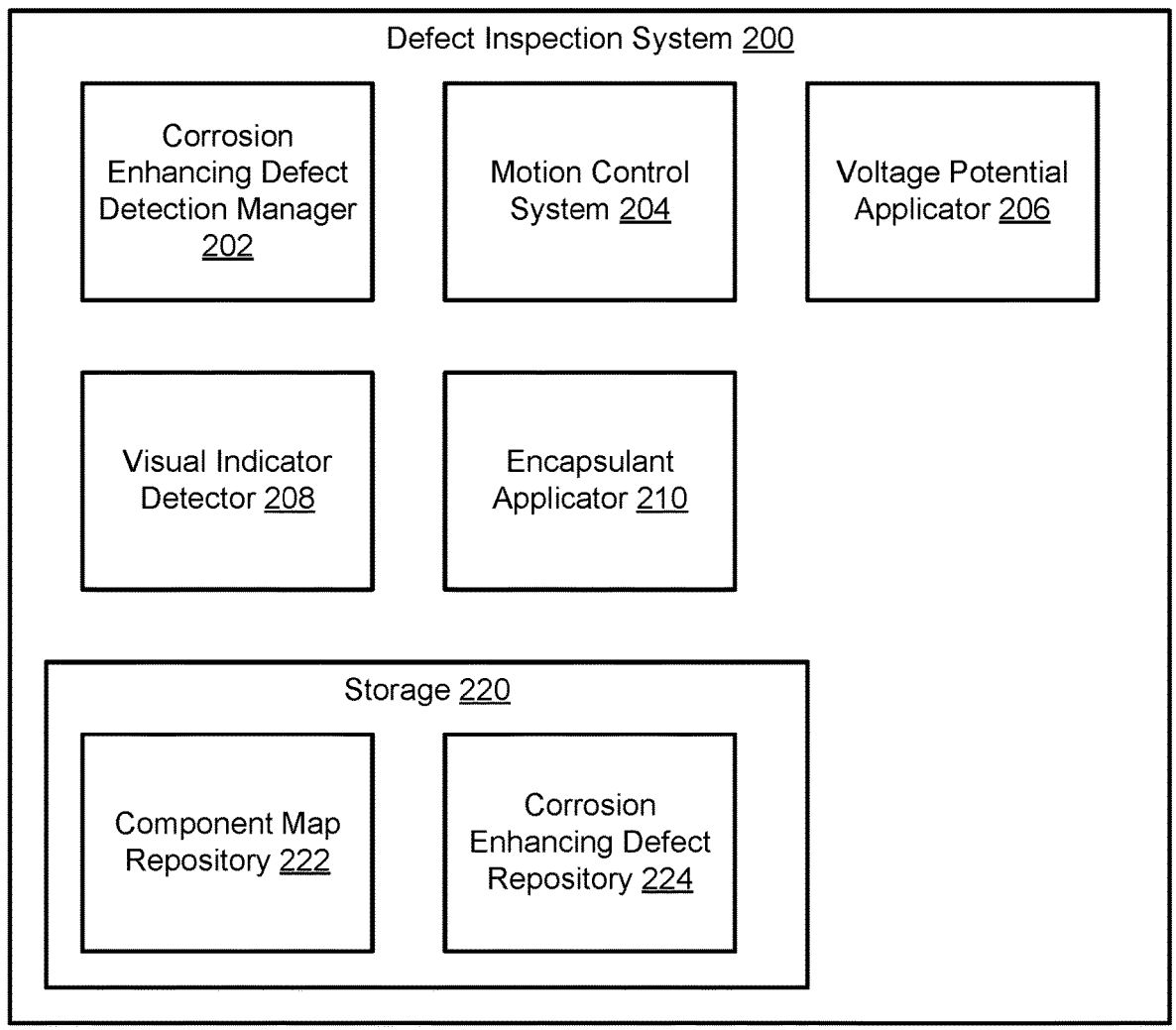
FIG. 2 shows a diagram of a defect inspection system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During operation, these components may be exposed to gases that may cause the components to corrode. Corrosion may cause the components to fail prior to the computing device meeting its service life goals. To reduce the impact of the environment on these components, protective layers may be utilized. A protective layer may be a layer of material (e.g., polymer) that prevents an ambient environment from interacting with one or more protected components. For example, a protective layer may encapsulate a portion of a component.

In the case of a circuit card, the protective layer may be implemented as a solder mask layer. The solder mask layer may protect traces and other metal portions of the circuit card from an environment in which the circuit card will be disposed.

However, protective layers may be imperfect. For example, protective layers may not fully encapsulate portions of components that the protective layers are intended to protect from the ambient environment. These imperfections, such as holes, may expose portions of the protected components to the ambient environment which may cause them to corrode at undesirable rates.

Embodiments of the invention may provide methods and systems that reduce the risk of corrosion related to defects in protective layers. To reduce the risk of protective layer defects, the system may identify whether such defects are present prior to the components being placed in corrosive environments.

The defects may be identified by generating chemical reaction products proximate to the defects. The chemical reaction products may highlight the presence of the defects.

Once identified, the defects in the protective layers may be remediated by apply an encapsulant. The encapsulant may cover exposed surfaces of the components due to the defects. Consequently, the defects may be remediated thereby prevent or reducing corrosion of components due to defects in protective layers.

By doing so, a system in accordance with embodiments of the invention that incorporates components which have been defect remediated may be less likely to prematurely fail due to corrosion, be more likely to meet their service life goals, be able to accept a wider range of intake gas conditions that may be more likely to cause corrosion without negatively impacting the components, and/or may be less costly to operate by reducing the necessary level of conditioning of gases used for cooling purposes.

FIG. 1.1 shows an information handling system (10) in accordance with one or more embodiments of the invention. The system may include a frame (110) and any number of chassis (e.g., 110A, 100B, 100C).

The frame (110) may be a mechanical structure that enables chassis to be positioned with respect to one another. For example, the frame (110) may be a rack mount enclosure that enables chassis to be disposed within it. The frame (110) may be implemented as other types of structures adapted to house, position, orient, and/or otherwise physically, mechanically, electrically, and/or thermally manage chassis. By managing the chassis, the frame (110) may enable multiple chassis to be densely packed in space without negatively impacting the operation of the information handling system (10).

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices.

Any number of components may be disposed in each of the respective chassis (e.g., 100A, 100B, 100C). These components may be portions of computing devices that provide computer implemented services, discussed in greater detail below.

When the components provide computer implemented services, the components may generate heat. For example, the components may utilize electrical energy to perform computations and generate heat as a byproduct of performing the computations. If left unchecked, buildup of heat within a chassis may cause temperatures of the components disposed within the chassis to exceed preferred ranges.

The preferred ranges may include a nominal range in which the components respectively operate (i) without detriment and/or (ii) are likely to be able to continue to operate through a predetermined service life of a component. Consequently, it may be desirable to maintain the temperatures of the respective components within the preferred range (e.g., a nominal range).

When a component operates outside of the preferred range, the service life of the component may be reduced, the component may not be able to perform optimally (e.g., reduced ability to provide computations, higher likelihood of error introduced into computations, etc.), and/or the component may be more likely to unexpectedly fail. The component may be subject to other undesirable behavior when operating outside of the preferred range without departing from the invention.

To operate components within the preferred range of temperature, the chassis may include air exchanges (e.g., 102). An air exchange (102) may be one or more openings in an exterior of a chassis that enables the chassis to exchange gases with an ambient environment. For example, a chassis may utilize air exchanges to (i) vent hot gases and (ii) intake cool gases. By doing so, the temperature of the gases within the chassis may be reduced. Consequently, the temperatures of components within the chassis may be reduced by utilizing the cooler gases taken into the chassis via an air exchange.

However, utilizing gases to cool components within a chassis may be problematic. The gases may not be benign. For example, the gases may be (i) chemically reactive, (ii) include humidity, and/or (iii) otherwise interact with components disposed within the chassis in an undesirable manner. The reaction between the gases used to cool the components and the components themselves (or other components proximate to the to-be-cooled components) may negatively impact the components disposed within the chassis.

For example, if the gases include a chemically reactive component (e.g., chlorine species), the gases may react (i.e., chemically react) with portions of the components disposed within the chassis. These reactions may damage portions of the components resulting in a decreased service life of the components.

In another example, if the gases include humidity, the humidity may (under certain conditions) condense resulting in water being disposed on the surface of the components. When water is disposed on the surface of components (even at very small levels), the water may chemically react with the components forming corrosion. The aforementioned reactions with the condensed water may damage the components or otherwise cause them to operate in an undesirable manner.

The potential reactions, discussed above, may cause numerous negative impacts. First, the reactions may impact the electrical conductivity of various components. For example, when metals react with chemically reactive species, condensed water vapor, etc., the metals may form chemical compounds that are substantially less conductive than the pure metals. The reduced conductivities of the components may negatively impact the electrical functionality of the components (e.g., circuits) disposed within the chassis.

Second, the reactions may impact the physical size of various components. For example, when metals chemically react, the products formed by the reactions may occupy significantly larger volumes than the unreacted metals (e.g., metal oxides vs elemental metals). The change in volumes of the reacted metals may negatively impact the electrical functionality of the components by, for example, forming open circuits by physically disconnecting various portions of the components from each other and/or other devices.

The potential reactions may cause other negative impacts beyond those discussed herein. The negative impacts may cause a device to fail prior to it meeting its service life. A service life may be a desired duration of operation of a component, device, or system.

To limit the exposure of components disposed in a chassis to corrosive environmental conditions, protective layers may be disposed on components disposed in a chassis. These protective layers may limit and/or prevent gases within a chassis from interacting with the components. Consequently, corrosion of the components may be prevented.

However, as discussed above, the protective layers may be imperfect. Defects in the protective layers disposed on the components may expose portions of the components to the corrosive environmental conditions present in chassis. Consequently, the components may be subject to corrosion even when protective layers have been applied to them for corrosion reduction/prevention purposes.

To address the above and/or other potential issues, embodiments of the invention may provide methods, devices, and systems that mitigate corrosion. To mitigate corrosion, defects in protective layers may be proactively identified, prior to the occurrence of corrosion. The identified defects may be remediated prior to exposing the components to corrosive environments. For example, the defects in protective layers may be repaired by filling them. Consequently, corrosion due to defects in protective layers may be reduced and/or prevented.

For additional details regarding proactive corrosion remediation, refer to FIGS. 1.3-1.7.

To further clarify corrosion of components disposed in a chassis, a diagram of a chassis in which corrosion sensitive components may reside is illustrated in FIG. 1.2.

Turning to FIG. 1.2, FIG. 1.2 shows a diagram of a chassis (100A) in accordance with one or more embodiments of the invention. A chassis may be a portion of an IHS and/or house all, or a portion, of an IHS. An information handling system may include a computing device that provides any number of services (e.g., computing implemented services).

To provide services, the computing device may utilize computing resources provided by computing components (140). The computing components (140) may include, for example, processors, memory modules, storage devices, special purpose hardware, and/or other types of physical components that contribute to the operation of the computing device. For additional details regarding computing devices, refer to FIG. 4.

Because the computing device uses computing components (140) to provide services, the ability of the computing device to provide services is limited based on the number and/or quantity of computing components that may be disposed within the chassis. For example, by adding additional processors, memory modules, and/or special purpose hardware devices, the computing device may be provided with additional computing resources which it may be used to provide services. Consequently, large number of computing components (140) that each, respectively, generate heat may be disposed within the chassis.

To maintain the temperatures of the computing components (140) (and/or other types of components) within a nominal range, gases may be taken in through an air exchange (102) using environmental control components (135). The gases may be passed by the computing components (140) to exchange heat with them. The heated gases may then be expelled out of another air exchange (102).

However, by taking in and expelling gases used for cooling purposes, the components disposed within the chassis (100A) may be subject to degradation due to corrosion. For example, as discussed above, the gases may include components such as humidity and/or chemical species that may chemically react with the computing components (140) and/or other types of components disposed in the chassis (100A) forming corrosion. The chemical reaction products (e.g., corrosion) may damage the structure and/or change the electrical properties of the computing components (140).

These changes may negatively impact the ability of the computing device to provide its functionality.

For example, the computing device may have a service life during which it is expected that the computing device will be likely to be able to provide its functionality. However, changes in the structure and/or electrical properties of the components disposed in the chassis (100A) due to exposure to humidity or other components of the gases used for temperature regulation purposes may cause the components to prematurely fail ahead of the service life of the computing device due to corrosion formation.

In general, embodiments of the invention provide methods, devices, and systems for managing corrosion within chassis. To manage corrosion, a system in accordance with embodiments of the invention may: (i) proactively identify defects in protective layers applied to components and (ii) remediate the defects prior to formation of corrosion due to the defects.

By doing so, embodiments of the invention may reduce the likelihood of components prematurely failing due to corrosion. By reducing the likelihood of the occurrence of premature failures of computing components due to corrosion, the computing devices disposed within the chassis (100A) may be more likely to meet their respective service life goals, have lower operation costs due to less stringent environmental management requirements, and/or require fewer repairs during their respective service life. For additional details regarding the computing components (140), refer to FIG. 1.3.

To manage the internal environment (104) of the chassis, the chassis (100A) may include any number of environmental control components (135). The environmental control components (135) may be used to cause gases to flow into and/or be expelled from the chassis (100A). The environmental control components (135) may include, for example, fans.

While the chassis (100A) of FIG. 1.2 has been illustrated as including a limited number of specific components, a chassis in accordance with one or more embodiments of the invention may include additional, fewer, and/or different components without departing from the invention. Additionally, while the chassis (100A) is illustrated as having a specific form factor (e.g., rack mount), a chassis in accordance with embodiments of the invention may have different form factors without departing from the invention.

As discussed above, the chassis (100A) may house computing components (140). Turning to FIG. 1.3, FIG. 1.3 shows a diagram of computing components (140) in accordance with one or more embodiments of the invention. The computing components (140) may enable computing devices to provide services, as discussed above.

The computing components (140) may include any number of hardware devices (142). The hardware devices (142) may include, for example, packaged integrated circuits (e.g., chips). The hardware devices (142) may enable any number and type of functionalities to be performed by a computing device.

The computing components (140) may also include a circuit card (144). The circuit card (144) may enable any of the hardware devices (142) to be operably connected to one another and/or other components not illustrated in FIG. 1.4. For example, the circuit card (144) may be a multilayer printed circuit board that includes circuitry (e.g., traces).

The circuit card (144) may include traces (146) that electrically interconnect various hardware devices (142) to one another and/or other components not illustrated in FIG. 1.4. The traces (146) may be formed out of conductive materials, such as, copper thereby enabling electrical power to be provided to the hardware devices (142), electrical signals to be distributed among the hardware devices (142), etc.

Returning to the hardware devices (142), these devices may consume electrical power and generate heat as a byproduct of performing their functionality. Further, the hardware devices (142) may have some sensitivity to temperature. For example, the hardware devices (142) may only operate nominally (e.g., as designed) when the temperatures of the respective hardware devices (142) are maintained within a preferred temperature range. Consequently, all, or a portion, of the hardware devices (142) may require some level of cooling to continue to operate nominally.

As discussed above, to facilitate cooling of the hardware devices (142), airflows within the chassis may be generated by environmental control components such as fans, heaters, etc. The airflows may cause gases that are at different temperatures and/or relative humidity levels to be taken into the chassis, used for cooling purposes, and then expelled from the chassis.

However, this process may be problematic because the gases used for cooling purposes may also contribute to corrosion being formed on, for example, the traces (146), interconnections between the traces (146) and the hardware devices (142), etc. For example, when the traces (146) are exposed to gases that include humidity, the metals of the traces (146) may react with the gases thereby forming corrosion.

The corrosion may, if kept to a low level, not impact the ability of the hardware devices (142) to perform their functionality over the course of the desired lifetime (e.g., service life) of a computing device. In contrast, if the rate of corrosion increases to a high enough level, the corrosion may negatively impact the ability of the hardware devices (142) to perform their respective functionalities to a level that causes the computing device to fail. Consequently, the computing device and corresponding IHS may fail prior to it meeting its desired service life due to corrosion.

For example, if an IHS has a desired service life of five years, corrosion may cause one of the traces (146) to fail prior to five years of service thereby causing the IHS to prematurely fail.

To reduce the impact of corrosion on the traces (146), hardware devices (142), and/or other components, any of the computing components (140) may include one or more protective layer. A protective layer may separate all, or a portion, of the component, from an ambient environment. By doing so, the portions of the components may be protected from the ambient environment. Consequently, the rate of corrosion of the protected portions of the components may be greatly reduced.

For example, consider the circuit card (144) of FIG. 1.3. The traces (146) disposed of the circuit card may include copper that, if exposed to an appropriate environment, may corrode. This corrosion may damage the traces. To address this potential issue, any number of portions of the traces (146) may be encapsulated in a protective layer. The protective layer may be, for example, a solder mask.

However, such protective layers may be subject to defects (e.g., holes or other imperfections). Defects in a protective layer may enable some of the portions of a component that are to be protected from an ambient environment to be exposed to the ambient environment. Consequently, the unprotected portions of the traces (146) proximate to defects in the protective layer may corrode. The corrosion of the unprotected portions of the traces (146) may cause the traces (146) and/or other components to fail (e.g., due to migration of corrosion products within a chassis).

Embodiments of the invention may provide methods and systems for proactively identifying and remediating defects in protective layers. By proactively remediating the defects, corrosion of protected components may be reduced and/or prevented.

For additional details regarding defect detection and remediation, refer to FIGS. 1.4-1.7 and 3. For additional details regarding a system for defect detection, refer to FIG. 2.

Turning to FIGS. 1.4-1.6, these figures show side view diagrams of a trace (150) in accordance with embodiments. The trace may extend into and out of the page in these figures.

In FIG. 1.4, the trace (150) in accordance with one or more embodiments of the invention is illustrated in a condition in which a protective layer (154) has been disposed on it that encapsulates the trace (150) in combination with a dielectric (152) layer of a circuit card.

For example, the protective layer (154) may be a solder mask disposed on top of a metallization layer of a circuit card that has been etched or otherwise machined into the trace (150). As seen in FIG. 1.4, the top, bottom, left, and right sides of the trace (150) are entirely encapsulated by the protective layer (154) and dielectric (152). Consequently, when disposed in an environment that may cause the trace (150) to corrode, the corrosion may be prevented or reduced in rate by virtue of the ambient environment being prevented from contacting the trace (150).

In other words, in FIG. 1.4, the protective layer (154) is entirely free of defects that could expose the trace (150) to the ambient environment. Consequently, if the trace (150) is placed in a chassis in which gases are circulating for thermal management purposes, the circulating gases are unlikely to cause the trace (150) to prematurely fail due to corrosion.

Turning to FIG. 1.5, in FIG. 1.5 the trace (150) in accordance with one or more embodiments is illustrated in a condition in which the protective layer (154) is disposed on it. However, unlike FIG. 1.4, in FIG. 1.5, the protective layer (154) includes defects. Specifically, protective layer sidewall defects (e.g., 156).

A protective layer sidewall defect (156) may be a defect in a protective layer associated with a side wall of a trace (or other type of component). The protective layer sidewall defect (156) may be a defect in the protective layer that exposes a portion of a trace to an ambient environment. Specifically, a sidewall of the trace (150) may not be protected by the protective layer (154) by virtue of the protective layer sidewall defect (156). The protective layer sidewall defect (156) may be a hole or other feature (void, tear, rip, etc.) in the protective layer (154) that prevents a corresponding portion of the trace (150) from being encapsulated by the protective layer (154).

In one or more embodiments of the invention, the protective layer sidewall defect (156) may not be seen when looking downward on a trace (e.g., looking toward the trace from above it in FIG. 1.5). For example, top surfaces of the trace (150) and dielectric (152) may be covered in the protective layer (154). Consequently, the presence of the protective layer sidewall defect (156) may be difficult to detect by visual inspection (e.g., may require off-normal viewing of the surface of the dielectric (152)).

For example, to detect the protective layer sidewall defect (156) by direct visual inspection, an off-normal view (e.g., at an angle other than 90 degrees with respect to a surface of the dielectric (152)) of the dielectric (152) may be required. However, such view may be extremely problematic due to limited depth of views of camera systems. For example, it may be difficult to focus a camera on a sidewall of a trace to determine whether the sidewall of the trace is encapsulated by the protective layer (154).

To detect exposed portions (158) of traces, a system in accordance with embodiments of the invention may employ an indirect method of identifying the presence of the exposed portions (158). Turning to FIG. 1.6, FIG. 1.6 shows a diagram of the trace of FIG. 1.6 in accordance with one or more embodiments of the invention in a condition in which the presence of the exposed portions (158) are indirectly identified by visual inspection.

In FIG. 1.6, the trace has been disposed in a visual indicator bath (162). The visual indicator bath (162) may be a liquid solution. The liquid solution may facilitate indirect visual detection of the exposed portions (158).

To indirectly visually detect the exposed portions (158), a voltage potential has been applied by a voltage source (164) between the trace (150) and a metal layer (160) of a circuit card. By doing so, free charge has been added to the trace (150).

By virtue of the presence of the free charge, the portions of the visual indicator bath (162) that directly contact the exposed portions (158) of the trace (150) may react (e.g., decompose) thereby forming exposed portions visual indicators (168). The exposed portions visual indicators (168) may be gases that form bubbles within the visual indicator bath (162). The bubbles may be detectable via visual inspection.

For example, the visual indicator bath (162) may include dyes or other materials that enables bubbles or other reactions products to be easily identified. The visual indicator bath (162) may include any type and/or number of liquids (e.g., methanol) that may generate the exposed portions visual indicators (168) without departing from the invention.

By virtue of the locality of the chemical reactions that generate the exposed portions visual indicators (168), the exposed portions visual indicators (168) are proximate to the exposed portions (158) of the trace. In other words, the chemical reactions that occur due to charging of the trace (150) may only occur proximate to the exposed portions (158) of the trace (150). Consequently, by detecting the presence (e.g., locations of) of the exposed portions visual indicators (168) through visual inspection (e.g., a camera looking downward with respect to FIG. 1.6), the corresponding portions of the trace (150) may be determined to be exposed portions (158).

While illustrated in FIG. 1.6 as applying the voltage potential between the trace (150) and a metal layer (160), the voltage potential may be applied between other components (e.g., between the trace (150) and a second trace on the same layer, between the trace (150) and a trace on a bottom layer, etc.) without departing from the invention.

Additionally, while illustrated with respect to a single trace (150), any number of traces may be charged (via applied voltage potentials) to cause exposed portions visual indicators (168) to be generated for as many traces as may be desired. Further, while described with respect to a trace (150), any type of component that may be protected by a protective layer (154) may be tested for the presence of exposed portions (158) via the method illustrated in FIG. 1.6. In addition, while the exposed portions have been illustrated in FIG. 1.6 as being sidewalls, the process illustrated in FIG. 1.6 may be used to detect other portions of traces and/or other components that are not protected by a protective layer without departing from the invention.

For example, pin-holing that may be too small to detect via direct visual inspection on a top surface of the trace may be detected via the method illustrated in FIG. 1.6.

Turning to FIG. 1.7, FIG. 1.7 shows a top view diagram of a circuit card (144) that is being tested via the method discussed with respect to FIG. 1.7. In other words, the circuit card (144) is disposed in a visual indicator bath. As seen in FIG. 1.7, traces (146) are disposed on the circuit card and protected by a protective layer. The traces may interconnect hardware device receivers (170) (e.g., groupings of pads) that may be used to operably connect hardware devices to the traces (146).

In FIG. 1.7, the traces (146) are charged (voltage supplies not illustrated for simplicity). Consequently, exposed portions visual indicators (168) are generated by virtue of the presence of defects in the protective layer. The locations of the exposed portions visual indicators (168) indicate that the corresponding portions of the traces (146) include exposed portions that are not protected from an ambient environment by the protective layer. Consequently, if left as shown in FIG. 1.7, these exposed portions may be subject to corrosion when disposed in a chassis. The corrosion of these exposed portions may cause the traces (146) to fail. Consequently, the hardware devices, received by the hardware device receivers (170), may be unable to provide all, or a portion, of their respective functionalities after the traces (146) (all or a portion) have failed.

To reduce the likelihood of failures of traces due to defects in protective layers, a defect inspection system (200) as illustrated in FIG. 2 may be utilized. FIG. 2 shows a diagram of a defect inspection system (200) in accordance with one or more embodiments of the invention.

The defect inspection system (200) may be utilized to identify the presence of defects in protective layers prior to exposing protected components to corrosive environments. The defects may be remediated by applying encapsulant. The encapsulant may fill in or otherwise prevent the defects in the protective layers from exposing the protected components to corrosive environments.

In one or more embodiments of the invention, the defect inspection system (200) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the defect inspection system (200) described through this application and all, or a portion, of the method illustrated in FIG. 3. The defect inspection system (200) may be implemented using other types of computing devices without departing from the invention. For additional details regarding computing devices, refer to FIG. 4.

In one or more embodiments of the invention, the defect inspection system (200) is implemented using distributed computing devices. As used herein, a distributed computing device refers to functionality provided by a logical device that utilizes the computing resources of one or more separate and/or distinct computing devices. For example, in one or more embodiments of the invention, the defect inspection system (200) is implemented using distributed devices that include components distributed across any number of separate and/or distinct computing devices. In such a scenario, the functionality of the defect inspection system (200) may be performed by multiple, different computing devices without departing from the invention.

To provide its functionality, the defect inspection system (200) may include a corrosion enhancing defect detection manager (202), a motion control system (204), a voltage potential applicator (206), a visual indicator detector (208), an encapsulant applicator (210), and storage (220). Each of these components of the defect inspection system (200) is discussed below.

The corrosion enhancing defect detection manager (202) may manage defects in protective layers. To manage defects in protective layers, the corrosion enhancing defect detection manager (202) may identify the presence of defects as described with respect to FIG. 1.7 and remediate the defects. To remediate the defects, the corrosion enhancing defect detection manager (202) may apply encapsulant to areas that have been identified as including the defects. By doing so, the defects may be remediated thereby reducing or preventing corrosion due to corrosion enhancing defects of computing components.

When providing its functionality, the corrosion enhancing defect detection manager (202) may orchestrate actions performed by the motion control system (204), voltage potential applicator (206), visual indicator detector (208), and/or encapsulant applicator (210). The corrosion enhancing defect detection manager (202) may do so via any method without departing from the invention.

When providing its functionality, the corrosion enhancing defect detection manager (202) may utilize the storage (220) by storing and using previously stored data structures.

Figure 3:
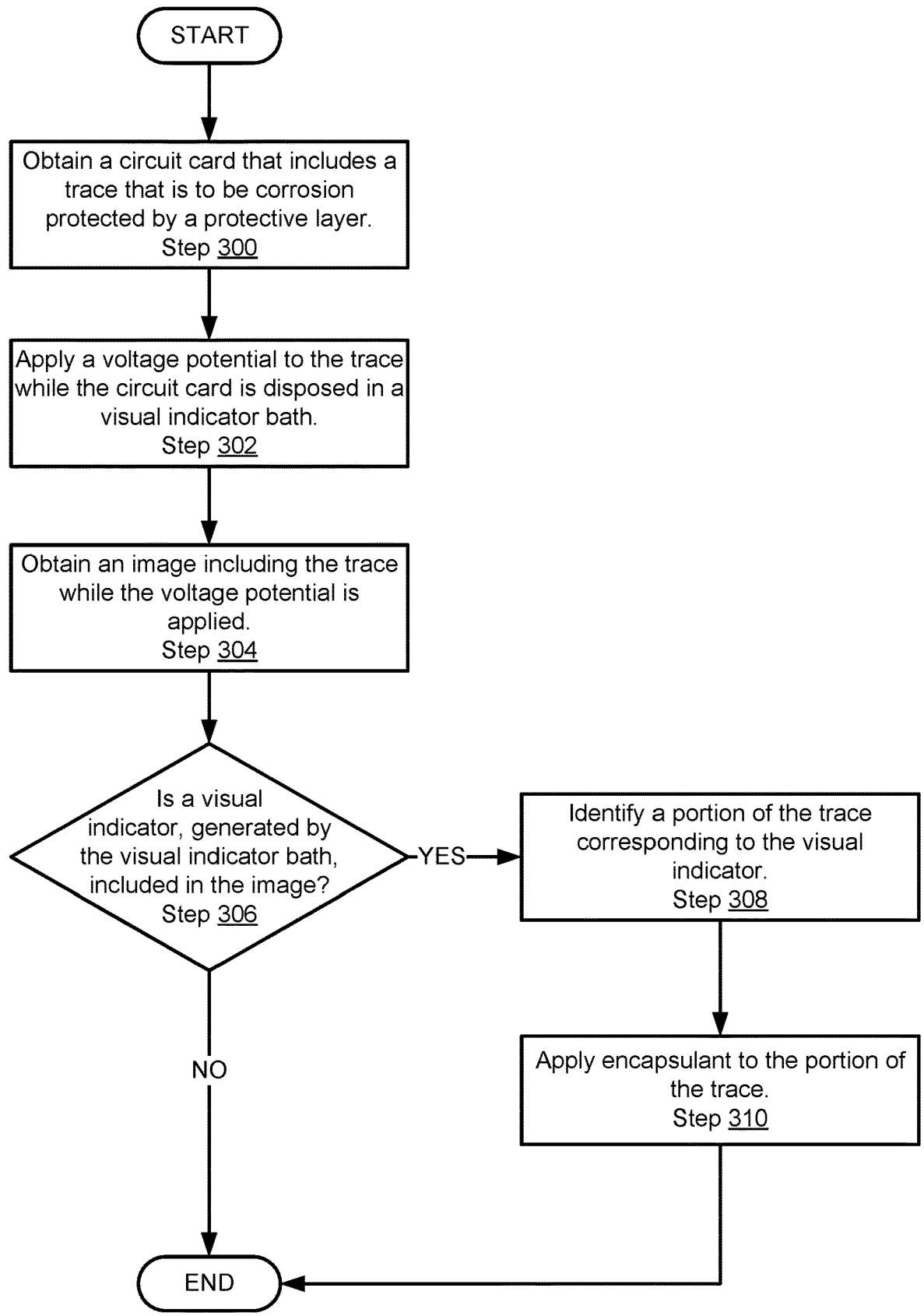
FIG. 3 shows a flowchart of a method of proactively managing corrosion in accordance with one or more embodiments of the invention.

To provide the above noted functionality of the corrosion enhancing defect detection manager (202), the corrosion enhancing defect detection manager (202) may perform all, or a portion, of the method illustrated in FIG. 3.

In one or more embodiments of the invention, the corrosion enhancing defect detection manager (202) is implemented using a hardware device including circuitry. The corrosion enhancing defect detection manager (202) may be implemented using, for example, a digital signal processor, a field programmable gate array, or an application specific integrated circuit. The corrosion enhancing defect detection manager (202) may be implemented using other types of hardware devices without departing from the invention.

In one or more embodiments of the invention, the corrosion enhancing defect detection manager (202) is implemented using computing code stored on a persistent storage that when executed by a processor performs all, or a portion, of the functionality of the corrosion enhancing defect detection manager (202). The processor may be a hardware processor including circuitry such as, for example, a central processing unit or a microcontroller. The processor may be other types of hardware devices for processing digital information without departing from the invention.

In one or more embodiments of the invention, the motion control system (204) manages movement of circuit cards that are being tested by the defect inspection system (200). For example, the motion control system (204) may be implemented using a conveyor that obtains to-be-tested circuit cards, places them with respect to the voltage potential applicator (206), the visual indicator detector (208), and/or the encapsulant applicator (210) in locations and orientations that enable these components of the defect inspection system (200) to provide their functionalities.

The motion control system (204) may be implemented using other types of physical devices for moving circuit cards without departing from the invention.

In one or more embodiments of the invention, the voltage potential applicator (206) is a device as described with respect to FIG. 1.6 that enables exposed portions visual indicators to be generated. For example, the voltage potential application (206) may include a bath in which the motion control system (204) may place a circuit card. While in the bath, a voltage source (e.g., 164, FIG. 1.6) of the voltage potential applicator (206) may charge one or more traces of the circuit card. The charging of the traces may cause the exposed portion visual indicators to be generated.

In one or more embodiments of the invention, the visual indicator detector (208) enables the exposed portion visual indicators generated by the voltage potential applicator (206) to be detected. The visual indicator detector (208) may be a camera disposed at a location that enables images of the circuit card disposed in the bath of the voltage potential applicator (206) to be obtained.

The visual indicator detector (208) may also include a computing device programmed to detect the presence and locations of exposed portions visual indicators within the images. The location information may be stored as part of a corrosion enhancing defect repository (224).

The encapsulant applicator (210) may be a physical device that deposits encapsulant on portions of the circuit card identified by the visual indicator detector (208). For example, the encapsulant applicator (210) may include an encapsulant dispenser that enables encapsulant to be disposed. Any type of dispenser for dispensing encapsulant may be used. The motion control system (204) may place the circuit card with respect to the encapsulant applicator (210) so that only those portions of the circuit card identified by the visual indicator detector (208) receive encapsulant from the encapsulant applicator (210).

In some embodiments of the invention, the encapsulant dispenser may simply dispense a marking material (e.g., paint). The marking material may indicate the presence of a corrosion enhancing defect. A technician or other person may then apply encapsulant to the portions marked by the marking material.

In one or more embodiments disclosed herein, the storage (220) is implemented using devices that provide data storage services (e.g., storing data and providing copies of previously stored data). The devices that provide data storage services may include hardware devices and/or logical devices. For example, storage (220) may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, storage (220) may include a memory device (e.g., a dual in line memory device) in which data is stored and from which copies of previously stored data are provided. In another example, storage (220) may include a persistent storage device (e.g., a solid state disk drive) in which data is stored and from which copies of previously stored data are provided. In a still further example, storage (220) may include: (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

The storage (220) may store data structures including a component map repository (222) and a corrosion enhancing defect repository (224). Each of these data structures is discussed below.

The component map repository (222) may include one or more data structures that include information regarding the types and locations of components of a circuit card which may be protected by protective layers. Additionally, the component map repository (222) may include information regarding the types of images and portions of the images that should be imaged to determine if any portions of the protective layers are not providing appropriate protection.

The information included in the component map repository (222) may be used to determined which portions of a circuit card to obtain images of and/or which sub-portions of images to analyze for exposed portions visual indicators (e.g., 168, FIG. 1.6). For example, a motion control system may utilize this information to appropriately place a circuit card with respect to a visual indicator detector (208) so that useful images of the circuit card may be obtained for exposed portions analysis (e.g., identifying whether portions of traces or other structures that should be covered in a protective layer are actually encapsulated by the protective layer).

The corrosion enhancing defect repository (224) may include one or more data structures that include information regarding defects in a protective layer. The information may be obtained by, for example, analysis of images obtained using a visual indicator detector (e.g., detecting exposed portions visual indicators in the images). The information regarding the defects may include where the defects are located.

The locations of the defects may be used by a motion control to position a circuit card with respect to an encapsulant applicator (210). By doing so, encapsulant deposited by the encapsulant applicator (210) may be selectively deposited on the circuit card corresponding to locations where defects in protective layers have been identified.

While the data structures stored in storage (220) have been described as including a limited amount of specific information, any of the data structures stored in storage (220) may include additional, less, and/or different information without departing from the embodiments disclosed herein. Further, the aforementioned data structures may be combined, subdivided into any number of data structures, may be stored in other locations (e.g., in a storage hosted by another device), and/or spanned across any number of devices without departing from the embodiments disclosed herein. Any of these data structures may be implemented using, for example, lists, table, linked lists, databases, or any other type of data structures usable for storage of the aforementioned information.

While the defect inspection system (200) of FIG. 2 has been described and illustrated as including a limited number of specific components for the sake of brevity, a defect inspection system in accordance with embodiments of the invention may include additional, fewer, and/or different components than those illustrated in FIG. 2 without departing from the invention.

Further, any of the components may be implemented as a service spanning multiple devices. For example, multiple computing devices housed in multiple chassis may each run respective instances of the corrosion enhancing defect detection manager (202). Each of these instances may communicate and cooperate to provide the functionality of the corrosion enhancing defect detection manager (202).

Returning to FIG. 2, the defect inspection system (200) may provide proactive corrosion mitigation services by reducing the impact defects in protection layers have on corrosion of circuit cards or other types of computing components. FIG. 3 illustrates a method that may be performed by the defect inspection system (200) of FIG. 2 when providing proactive corrosion mitigation services.

FIG. 3 shows a flowchart of a method in accordance with one or more embodiments of the invention. The method depicted in FIG. 3 may be used to mitigate the impact of corrosion due to protective layer defects in accordance with one or more embodiments of the invention. The method shown in FIG. 3 may be performed by, for example, a corrosion enhancing defect detection manager (e.g., 202, FIG. 2). Other components of the system illustrated in FIGS. 1.1-2 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, a circuit card is obtained that includes a trace that is to be corrosion protected from corrosion by a protective layer. The circuit card may be obtained, for example, by a motion control system. The motion control system may be part of a defect detection system.

The circuit card may be obtained by removing the circuit card from a stack of circuit cards which are to be analyzed for protective layer defects. The motion control system may do so in response to messages from a corrosion enhancing defect detection manager. The message may include instructions that cause the motion control system to obtain the circuit card. The circuit board may be obtained via other methods and from other locations without departing from the invention.

In step 302, a voltage potential is applied to the trace while the circuit card is disposed in a visual indicator bath. The voltage potential may be applied across the trace and a second trace or another conductive feature (e.g., of the circuit card or of a power supply applying the voltage such as a lead) disposed in the visual indicator bath.

Applying the voltage may charge the trace. Any exposed portions of the trace may begin to cause portions of the visual indicator bath to react due to the presence of the charge on the trace. The charge may cause bubbles (e.g., gas products of the reaction of the visual indicator bath with the charge from the trace) to form on the surface of the exposed portions of the charged trace. The bubbles may grow in size until they release from the surface of the trace forming a trail of bubbles emanating from the exposed surfaces of the trace. In other words, bubbles may emanate from portions of the trace that are not actually protected from an ambient environment by the protective layer.

In step 304, an image including the trace is obtained while the voltage potential is applied. An image sensor or other type of device may be used to obtain the image. The image may include information reflecting the presence of any bubbles proximate to different portions of the circuit card.

The image may be taken from a predetermined location and/or orientation. Consequently, the pixels of the image corresponding to the bubbles may indicate the presence of exposed portions of the traces at known locations on the circuit board by virtue of the known relative location of the sensor and the circuit with respect to one another.

In step 306, it is determined whether a visual indicator, generated by the visual indicator bath, is included in the image. In one or more embodiments of the invention, the visual indicators are bubbles, as described with respect to step 304. The visual indicator may be other types of indicators corresponding to different types of reaction products (e.g., other than gases) of chemical reactions that may be used to determine the presence, or lack, of exposed portions of the trace. The determination may be made (e.g., the lack or presence of bubbles or other types of images corresponding to chemical reaction products indicating the presence of exposed portions of the trace) by analyzing the image obtained in step 304. The analysis may be performed using any type of image recognition technology.

If one or more visual indicators are present in the image, the locations of the circuit card corresponding to the locations of the visual indicators may be determined and stored for future use.

If it is determined that a visual indicator is included in the image, the method may proceed to step 308. If it is determined that no visual indicators are included in the image, the method may end following step 306.

In step 308, a portion of the trace corresponding to the visual indicator is identified. As noted above, by virtue of the known locations of the detector used to obtain the image and the sensor, the locations of the pixels corresponding to the visual indicator may be associated with a corresponding location on the circuit card. The corresponding location on the circuit card may be the portion of the trace identified in step 308.

In step 310, encapsulant is applied to the portion of the trace. The encapsulant may be applied by using a motion control system to position the circuit card with respect to an encapsulant dispenses so that the encapsulant dispenser is aligned with the portion of the trace. Once aligned, the encapsulant dispense may dispense encapsulant. The encapsulant dispenser may dispense encapsulant using any method (e.g., applying pressure to an encapsulant supply attached to a nozzle that is now-disposed proximate to the trace by a motion control system).

After the encapsulant is applied, the encapsulant may be cured to form a protective layer that encapsulates a corresponding exposed portion of the trace. For example, the exposed portion of the trace may be a sidewall of the trace.

Curing the encapsulant may be performed based on the type of encapsulant. The curing process may include, for example, heating the encapsulant, exposing the encapsulant to ultraviolet light (or other types of radiation), and/or placing the encapsulant in an inert or vacuum environment.

The method may end following step 310.

Using the method in FIG. 3, defects in protective layers that would otherwise enhance the corrosion of components for which the protective layers are to provide corrosion management services may be identified and remediated. Consequently, the components (e.g., traces, pins, other metallic/conductive structures, components form from non-conductive/non-metallic materials that may be sensitive to corrosion) of circuit boards that receive corrosion management services from protective layers may be more likely to meet their service life goals by virtue of the reduced corrosion of these components.

Figure 4:
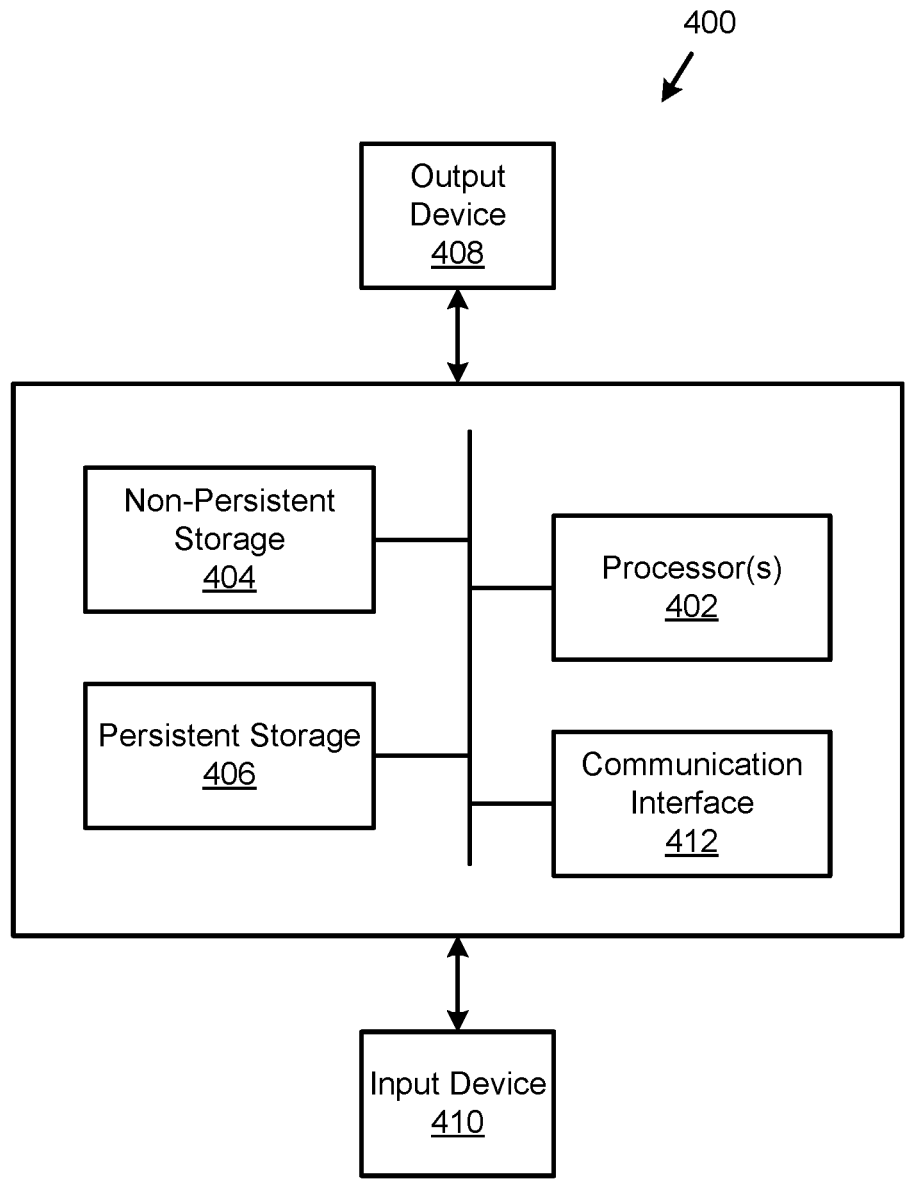
FIG. 4 shows a diagram of a computing device in accordance with one or more embodiments of the invention.

As discussed above, embodiments of the invention may be implemented using a computing device. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide an improved method for managing corrosion of components of an information handling system. Specifically, embodiments of the invention may provide a method and system for managing corrosion by reducing defects included in protective layers adapted to reduce the corrosion of the components to ambient environment conditions. To do so, embodiments of the invention may provide a system that identifies defects in protective layers that may be difficult to identify using direct visual identification. To identify the defects, the system may use an indirect method of visual identification by generating chemical reaction products proximate to the locations where the defects are present. The chemical reaction products may be easily identifiable by visual inspection. The locations of the chemical reaction products may be used to determine where encapsulant should be deposited to remediate the defects in the protective layer. By doing so, protective layers in accordance with embodiments of the invention may include fewer defects. Consequently, components protected by the protective layers may be less likely to fail, be less costly to service, and may be better able to operate in corrosive environment without failing to the environment.

Thus, embodiments of the invention may address the problem of environments that may cause premature failures of devices due to corrosion. Specifically, embodiments of the invention may provide a method of proactively managing corrosion that enables less power to be consumed for environmental conditioning purposes be improving the likelihood that existing corrosion safeguards (e.g., protective layers) will successfully prevent and/or reduce corrosion formation.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A defect inspection system, comprising:
   storage; and
   a corrosion enhancing defect detection manager programmed to:
      obtain a circuit card comprising a trace that is to be encapsulated by a protective layer adapted to reduce corrosion of the trace;
      apply a voltage potential to the trace while the circuit card is disposed in a visual indicator bath;
      obtain an image of the trace while the voltage potential is applied;
      make a determination, based on an analysis of the image, that a visual indicator generated by the visual indicator bath is included in the image; and
      based on the determination:
         identify a portion of the trace corresponding to the visual indicator; and
         apply encapsulant to the portion of the trace,
   wherein the corrosion enhancing defect detection manager is implemented using one selected from a group consisting of a hardware device comprising circuitry and computing code executed by the hardware device.

2. The defect inspection system of claim 1, wherein the visual indicator bath comprises:
   a liquid that generates gases when the voltage potential is applied to the liquid through the trace.

3. The defect inspection system of claim 2, wherein the liquid comprises methanol.

4. The defect inspection system of claim 2, wherein the visual indicator bath further comprises:
   a dye that highlights the visual indicator.

5. The defect inspection system of claim 1, wherein the visual indicator indicates a presence of a defect in the protective layer.

6. The defect inspection system of claim 5, wherein the defect is not visible in the image.

7. The defect inspection system of claim 5, wherein the defect is not detectible from a top view of the circuit card, wherein the top view of the circuit card is orthogonal to layers of the circuit card.

8. The defect inspection system of claim 5, wherein the defect is a hole in the protective layer that exposes a sidewall of the trace of the circuit card.

9. The defect inspection system of claim 8, wherein applying the encapsulant to the portion of the trace encapsulates the sidewall of the trace of the circuit card.

10. The defect inspection system of claim 1, wherein the voltage potential is applied across the trace and a second trace of the circuit card.

11. A method for managing corrosion enhancing defects in circuit cards, comprising:

obtaining, by a corrosion enhancing defect detection manager, a circuit card of the circuit cards, wherein the circuit card comprises a trace that is to be encapsulated by a protective layer adapted to reduce corrosion of the trace;

applying a voltage potential to the trace while the circuit card is disposed in a visual indicator bath;

obtaining an image of the trace while the voltage potential is applied;

making a determination, based on an analysis of the image, that a visual indicator generated by the visual indicator bath is included in the image; and based on the determination:

identifying a portion of the trace corresponding to the visual indicator as including a corrosion enhancing defect of the corrosion enhancing defects; and applying encapsulant to the portion of the trace to remediate the corrosion enhancing defect, wherein the corrosion enhancing defect detection manager is implemented using one selected from a group consisting of a hardware device comprising circuitry and computing code executed by the hardware device.

12. The method of claim 11, wherein the visual indicator bath comprises:

a liquid that generates gases when the voltage potential is applied to the liquid through the trace.

13. The method of claim 12, wherein the liquid comprises methanol.

14. The method of claim 12, wherein the visual indicator bath further comprises:

a dye that highlights the visual indicator.

15. The method of claim 11, wherein the visual indicator indicates a presence of the corrosion enhancing defect in the protective layer.

16. A non-transitory computer readable medium comprising computing code, which when executed by a hardware device comprising circuitry, enables the hardware device to perform a method for managing corrosion enhancing defects in circuit cards, the method comprising:

obtaining, by a corrosion enhancing defect detection manager, a circuit card of the circuit cards, wherein the circuit card comprises a trace that is to be encapsulated by a protective layer adapted to reduce corrosion of the trace;

applying a voltage potential to the trace while the circuit card is disposed in a visual indicator bath;

obtaining an image of the trace while the voltage potential is applied;

making a determination, based on an analysis of the image, that a visual indicator generated by the visual indicator bath is included in the image; and based on the determination:

identifying a portion of the trace corresponding to the visual indicator as including a corrosion enhancing defect of the corrosion enhancing defects; and applying encapsulant to the portion of the trace to remediate the corrosion enhancing defect, wherein the corrosion enhancing defect detection manager is implemented using one selected from a group consisting of the hardware device and the computing code executed by the hardware device.

17. The non-transitory computer readable medium of claim 16, wherein the visual indicator bath comprises:

a liquid that generates gases when the voltage potential is applied to the liquid through the trace.

18. The non-transitory computer readable medium of claim 17, wherein the liquid comprises methanol.

19. The non-transitory computer readable medium of claim 17, wherein the visual indicator bath further comprises:

a dye that highlights the visual indicator.

20. The non-transitory computer readable medium of claim 16, wherein the visual indicator indicates a presence of the corrosion enhancing defect in the protective layer.

\* \* \* \* \*